United States Patent
Cheng

(10) Patent No.: US 10,813,223 B2
(45) Date of Patent: Oct. 20, 2020

(54) PIEZOCHROMIC STAMP

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 220 days.

(21) Appl. No.: 16/115,566

(22) Filed: Aug. 29, 2018

(65) Prior Publication Data

US 2018/0376599 A1    Dec. 27, 2018

Related U.S. Application Data

(62) Division of application No. 15/252,247, filed on Aug. 31, 2016, now Pat. No. 10,098,234.

(60) Provisional application No. 62/309,930, filed on Mar. 17, 2016.

(51) Int. Cl.
| | |
|---|---|
| B23P 19/00 | (2006.01) |
| H05K 3/06 | (2006.01) |
| G03F 7/00 | (2006.01) |
| H05K 3/46 | (2006.01) |
| G03F 7/16 | (2006.01) |
| G03F 7/20 | (2006.01) |
| H05K 1/11 | (2006.01) |
| H05K 3/00 | (2006.01) |
| H05K 3/10 | (2006.01) |

(52) U.S. Cl.
CPC .......... *H05K 3/064* (2013.01); *G03F 7/0002* (2013.01); *G03F 7/162* (2013.01); *G03F 7/20* (2013.01); *H05K 1/115* (2013.01); *H05K 3/0023* (2013.01); *H05K 3/06* (2013.01); *H05K 3/108* (2013.01); *H05K 3/465* (2013.01); *H05K 3/4644* (2013.01); *H05K 2201/091* (2013.01); *H05K 2203/0108* (2013.01); *H05K 2203/0369* (2013.01); *H05K 2203/0502* (2013.01); *H05K 2203/0548* (2013.01); *H05K 2203/0562* (2013.01); *Y10T 29/49124* (2015.01); *Y10T 29/49155* (2015.01); *Y10T 29/5313* (2015.01)

(58) Field of Classification Search
CPC ......... Y10T 29/49124; Y10T 29/53209; Y10T 29/5313; H05K 1/115; H05K 2203/0502; H05K 2203/0548; H05K 3/0023; H05K 3/064; H05K 3/4644
USPC ......... 29/747, 829, 825, 846, 847, 729, 738, 29/745, 842, 857
See application file for complete search history.

(56) References Cited

U.S. PATENT DOCUMENTS

| | | | |
|---|---|---|---|
| 8,946,080 B2 * | 2/2015 | Yoneda | G03F 1/50 257/E21.584 |
| 2006/0041099 A1 | 2/2006 | Cernohous et al. | |
| 2012/0295435 A1 | 11/2012 | Yoneda | |

FOREIGN PATENT DOCUMENTS

TW    201206721    2/2012

* cited by examiner

Primary Examiner — Thiem D Phan
(74) Attorney, Agent, or Firm — JCIPRNET

(57) ABSTRACT

A piezochromic stamp is provided, wherein when a pressing side of the piezochromic stamp is subjected to a pressure, a light transmittance effect of the pressing side is changed from allowing a light having a specific wavelength to pass through to blocking the light having the specific wavelength, or the light transmittance effect of the pressing side is changed from blocking the light having the specific wavelength to allowing the light having the specific wavelength to pass through.

1 Claim, 8 Drawing Sheets

PIEZOCHROMIC STAMP

CROSS-REFERENCE TO RELATED APPLICATION

This application is a divisional application of U.S. patent application Ser. No. 15/252,247, filed on Aug. 31, 2016, now allowed. The prior application Ser. No. 15/252,247 claims the priority benefit of U.S. provisional application Ser. No. 62/309,930, filed on Mar. 17, 2016. The entirety of each of the above-mentioned patent applications is hereby incorporated by reference herein and made a part of this specification.

BACKGROUND OF THE INVENTION

Field of the Invention

The invention relates to a stamp, and more particularly, to a piezochromic stamp.

Description of Related Art

Nano-imprint lithography (NIL) is a technique for manufacturing fine circuits and is extensively applied in the LED and OLED industries. NIL includes pressing a mold prototype having a pattern (generally referred to as mold, stamp, or template) on an etchant or a photoresist to mechanically deform the mold prototype so as to precisely transfer a fine pattern. Therefore, once the manufacture of the mold is complete, a fine structure such as a nano structure can be repeatedly molded in a simple manner, and manufacturing costs and the production of harmful waste in the manufacture can be effectively reduced. As a result, NIL has been expected to be applied in various areas in recent years.

However, after NIL transfers a pattern to a photoresist using a mold, comprehensive exposure needs to be performed, and therefore the patterned photoresist layer to be formed and the unnecessary residual photoresist layer are both exposed to light. As a result, the residual photoresist layer cannot be removed by a developing solution in a simple manner. Therefore, unnecessary residual photoresist layer needs to be removed using inductively-coupled plasma (ICP) or reactive ion etching (RIE), such that the photoresist pattern to be formed is readily damaged and the process yield is poor. Therefore, how to remove the residual photoresist layer without damaging the fine pattern transferred to the photoresist layer is an important topic for the industry.

SUMMARY OF THE INVENTION

The invention provides a piezochromic stamp, wherein when the pressing side of the piezochromic stamp is subjected to pressure, the light transmittance effect of the pressing side is changed from allowing light having a specific wavelength to pass through to blocking light having the specific wavelength, or the light transmittance effect of the pressing side is changed from blocking light having a specific wavelength to allowing light having the specific wavelength to pass through.

Based on the above, in the invention, when the piezochromic stamp is subjected to pressure, the light transmittance effect of the pressing side is changed from allowing light having a specific wavelength to pass through to blocking light having the specific wavelength, or the light transmittance effect of the pressing side is changed from blocking light having a specific wavelength to allowing light having the specific wavelength to pass through. Therefore, when the piezochromic stamp having a pattern is pressed on the photoresist layer via a suitable force, the portion of the piezochromic stamp in contact with the conductive seed layer can be changed to have the characteristic of blocking or allowing the transmittance of light having a specific wavelength. Therefore, after an exposure process is performed on the photoresist layer, the uncured photoresist layer can be removed in a simple manner using a developing solution, so as to precisely transfer the circuit pattern to be formed to the patterned photoresist layer.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present specification, "piezochromic stamp" refers to a stamp containing a piezochromic material, and when the piezochromic material is subjected to pressure, the material characteristics of the piezochromic material itself are changed, such that the light transmittance effect thereof is changed from allowing light having a specific wavelength to pass through to blocking light having the specific wavelength, or is changed from blocking light having a specific wavelength to allowing light having the specific wavelength to pass through. For instance, when the piezochromic material is subjected to pressure, color change can occur to the piezochromic material to block light having a specific wavelength or allow light having the specific wavelength to pass through. Moreover, when the piezochromic material is subjected to pressure, changes in material characteristics (not color change) can also occur via the same or similar principles to generate the effect of blocking or allowing the transmittance of light having a specific wavelength. In the following embodiments, changes to the piezochromic stamp due to pressure are not limited to color, and any piezochromic stamp generating change capable of blocking or allowing the transmittance of light having a specific wavelength is within the scope of the piezochromic stamp of the invention.

FIG. 1A to FIG. 1F are schematics of the manufacturing method of a circuit board according to the first embodiment of the invention.

Figure 1A:
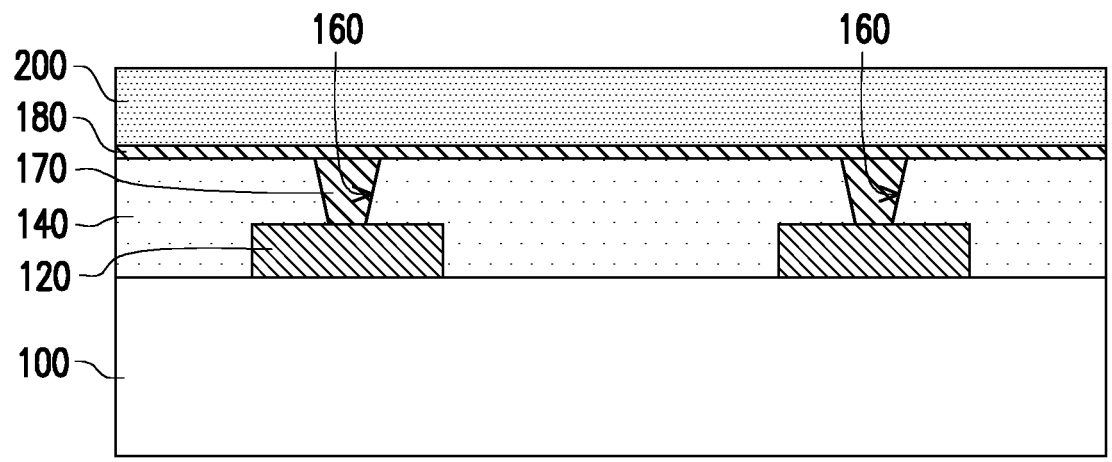
FIG. 1A to FIG. 1F are schematics of the manufacturing method of a circuit board according to the first embodiment of the invention.

Referring to FIG. 1A, a circuit pattern 120 is formed on a dielectric substrate 100. The circuit pattern 120 is formed by, for instance, first forming a conductive layer on the dielectric substrate 100 via a lamination method and performing a patterning process on the conductive layer. The material of the dielectric substrate 100 is, for instance, epoxy resin, glass fiber cloth, or ceramic. The material of the circuit pattern 120 is, for instance, copper.

Next, a dielectric layer 140 is formed on the dielectric substrate 100 and covers the circuit pattern 120 on the dielectric substrate 100. The material of the dielectric layer 140 is, for instance, epoxy resin. The dielectric layer 140 is, for instance, formed on the dielectric substrate 100 via a lamination method. The dielectric layer 140 has a hole 160 exposing a portion of the circuit pattern 120. The forming method of the hole 160 includes, for instance, laser drilling or mechanical drilling.

Then, a conductive via 170 is formed in the hole 160. The forming method of the conductive via 170 includes, for instance, forming a conductive material layer in the hole 160 and on the dielectric layer 140 via an electroplating method, and then performing a planarization process to remove the conductive material layer outside the hole 160. Then, a conductive seed layer 180 is formed on the dielectric layer 140. The material of the conductive seed layer 180 is, for instance, copper.

Next, a photoresist layer 200 is formed on the conductive seed layer 180. The forming method of the photoresist layer 200 is, for instance, a spin coating method. In the present embodiment, the photoresist layer 200 is, for instance, a negative photoresist, and the portion thereof irradiated by light having a specific wavelength in a subsequent exposure process is cured and is kept in the developing process.

Figure 1B:
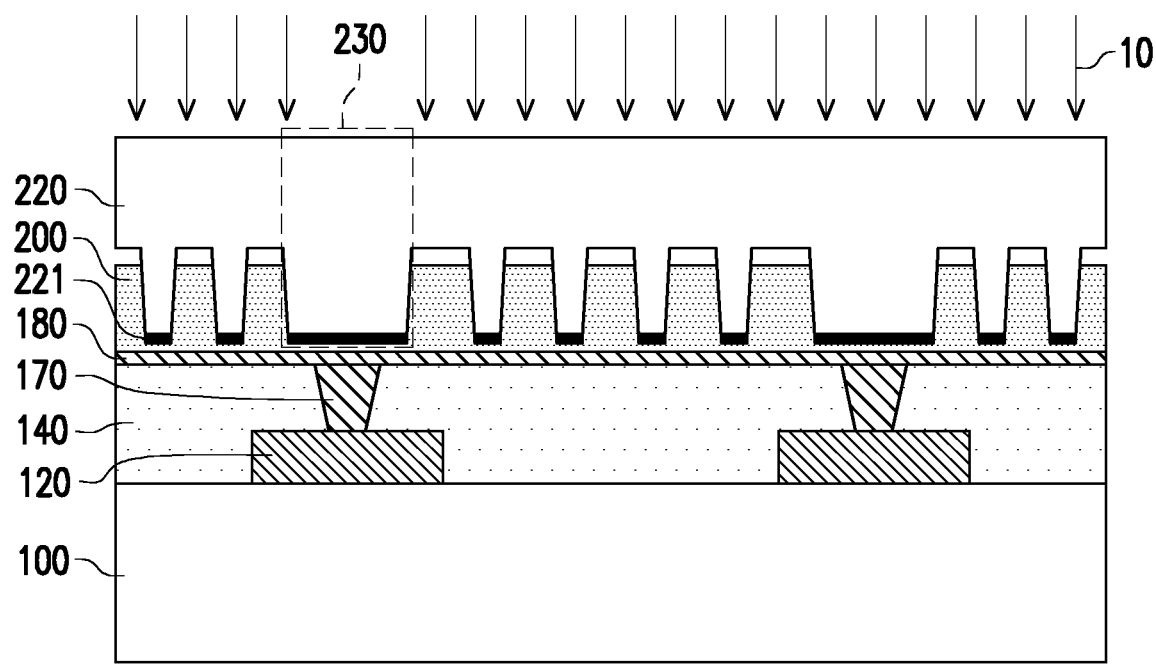
Figure 1B:
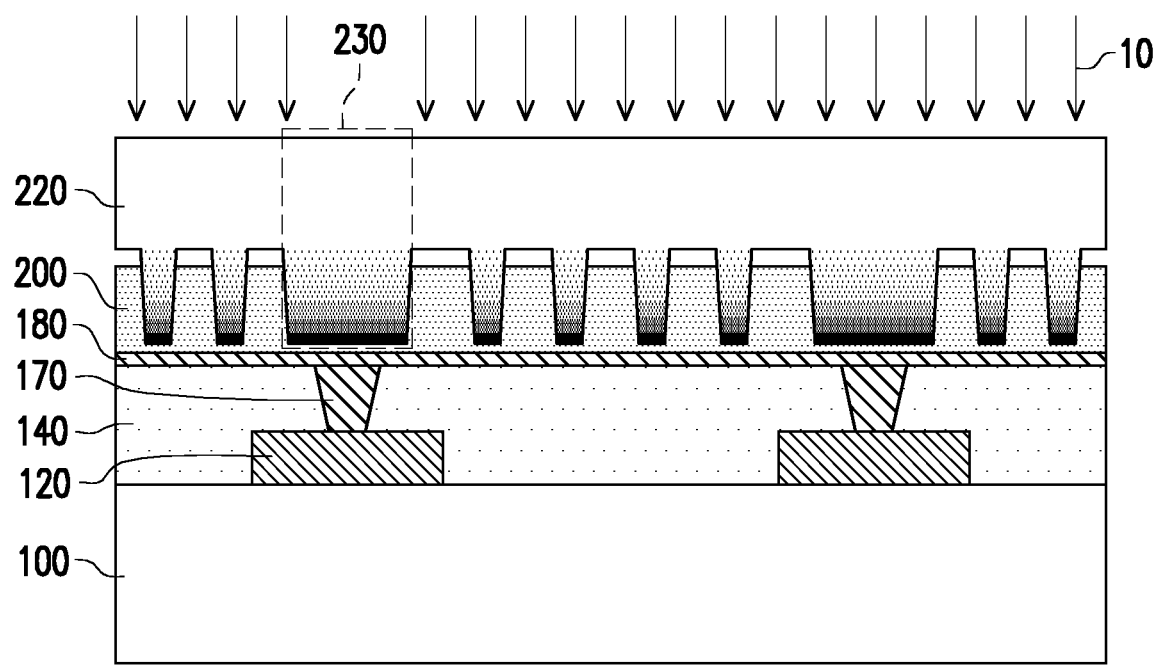

Referring to FIG. 1B, imprinting is performed on the photoresist layer 200 via a piezochromic stamp 220. The piezochromic stamp 220 has a pattern corresponding to the circuit pattern to be formed on the dielectric substrate 100. When the piezochromic stamp 220 is pressed on the photoresist layer 200, mechanical deformation can occur to the photoresist layer 200, such that a pattern is precisely transferred on the photoresist layer 200. In the imprinting process, a pressing side 230 of the piezochromic stamp 220 in contact with the conductive seed layer 180 generates a counterforce to form a pressure, such that when the piezochromic stamp 220 is in contact with the conductive seed layer 180, the light transmittance effect of the pressing side 230 is changed from allowing light having a specific wavelength to pass through to blocking light having the specific wavelength, or the light transmittance effect of the pressing side 230 is changed from blocking light having a specific wavelength to allowing light having the specific wavelength to pass through. In the present embodiment, the pressing side 230 includes a portion of the piezochromic stamp 220 and a piezochromic material layer 221 attached to the portion. "The piezochromic stamp 220 is in contact with the conductive seed layer 180" means that a very thin and unavoidable photoresist layer 200 exists between the piezochromic stamp 220 and the conductive seed layer 180 (as shown in FIG. 1B). In particular, for the large contact area between the piezochromic stamp 220 and the conductive seed layer 180, the very thin and unavoidable photoresist layer (also referred to as photoresist residue) is largely concentrated in the center of the contact region. For instance, the thickness distribution of the photoresist residue shows a roughly Gaussian distribution from the periphery to the center (not specifically shown in the figure).

Specifically, in the present embodiment, since the photoresist layer 200 used is a negative photoresist layer, when the piezochromic stamp 220 is in contact with the conductive seed layer 180, the light transmittance effect of the pressing side 230 needs to be changed from allowing light having a specific wavelength to pass through to blocking light having the specific wavelength. For instance, in the case that the photoresist layer 200 is cured by UV irradiation, the piezochromic material layer 221 of the piezochromic stamp 220 in contact with the conductive seed layer 180 is changed to blocking UV transmittance, and the other portions of the piezochromic stamp 220 still allow UV transmittance.

Next, exposure is performed on the photoresist layer 200 via a UV light 10 by using the piezochromic stamp 220 as a mask. In the present embodiment, since the photoresist layer 200 is a negative photoresist layer and the piezochromic material layer 221 can block the transmittance of the UV light 10 used in the exposure process, the photoresist layer 200 between the piezochromic material layer 221 and the conductive seed layer 180 is not irradiated, and the other portions of the photoresist layer 200 are cured by irradiation.

Figure 1C:
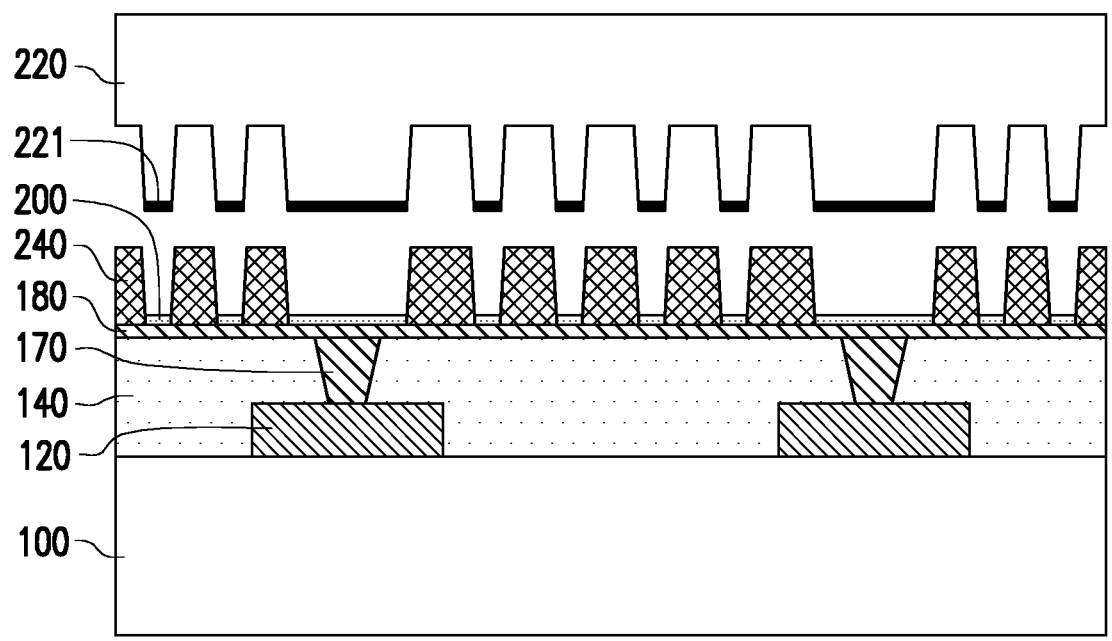

Referring to FIG. 1C, after the exposure process, the piezochromic stamp 220 is removed. At this point, a cured patterned photoresist layer 240 is forming on the conductive seed layer 180 and the uncured photoresist layer 200 remains.

Figure 1D:
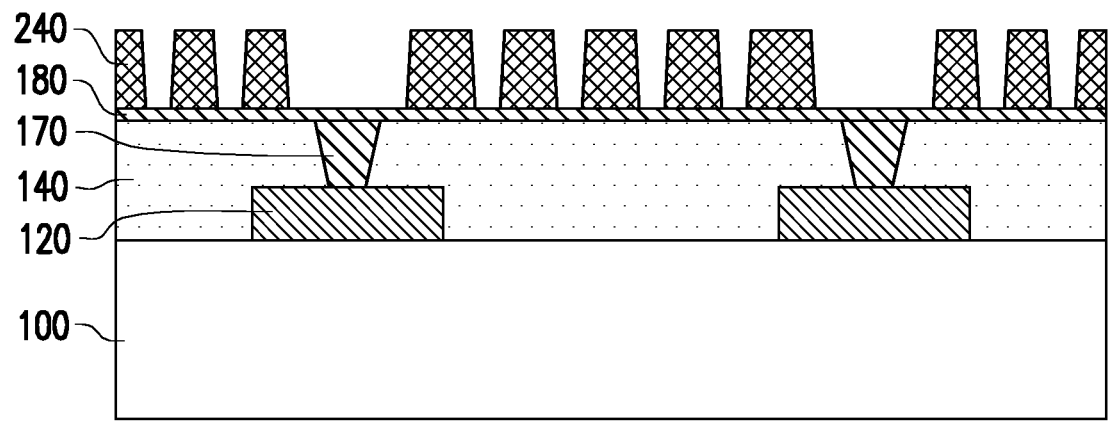

Referring to FIG. 1D, a developing process is performed. Since the cured patterned photoresist layer 240 is not removed in the developing process and only the uncured photoresist layer 200 is removed, a portion of the conductive seed layer 180 can be exposed (the region in which a circuit pattern is to be subsequently formed). In other words, via the method of FIG. 1A to FIG. 1D, the pattern of the piezochromic stamp 220 (corresponding to the circuit pattern to be formed on the dielectric substrate 100) can be precisely transferred to the photoresist layer 200 to form the patterned photoresist layer 240.

Figure 1E:
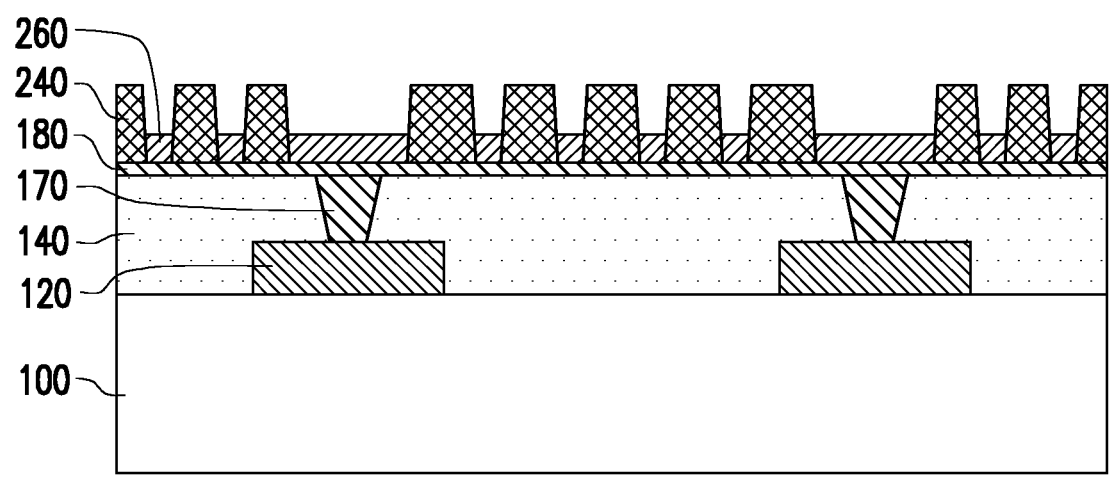

Referring to FIG. 1E, a patterned metal layer 260 is formed on the conductive seed layer 180 exposed by the patterned photoresist layer 240. The material of the patterned metal layer 260 is, for instance, copper. The forming method of the patterned metal layer 260 includes, for instance, performing electroplating by using the conductive seed layer 180 as a seed layer.

Figure 1F:
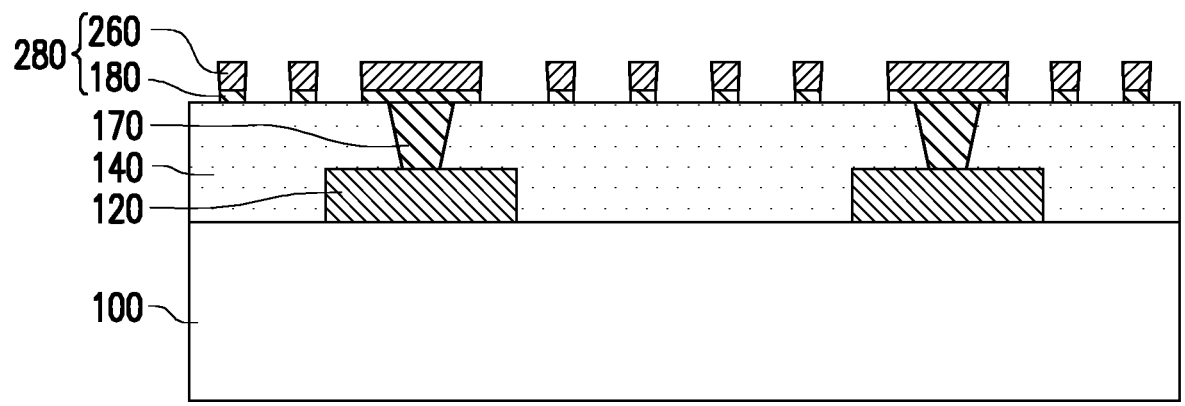

Referring to FIG. 1F, the patterned photoresist layer 240 and the conductive seed layer 180 located under the patterned photoresist layer 240 are removed to expose a portion of the dielectric layer 140. As a result, a circuit pattern 280 (formed by the patterned metal layer 260 and the conductive seed layer 180 located on the dielectric layer 140 below the patterned metal layer 260) can be formed.

In the above embodiments, the pressing side 230 includes a portion of the piezochromic stamp 220 and the piezochromic material layer 221 attached to the portion. However, the invention is not limited thereto. In another embodiment, the piezochromic stamp 220 itself can be made by a piezochromic material. Therefore, when the pressing side 230 is in contact with the conductive seed layer 180, the light transmittance effect of the pressing side 230 is changed from allowing light having a specific wavelength to pass through to blocking light having the specific wavelength, or the light transmittance effect of the pressing side 230 is changed from blocking light having a specific wavelength to allowing light having the specific wavelength to pass through. Moreover, in the pressing side 230, the pressure of the counterforce may be gradually decreasing in a direction away from the conductive seed layer 180 such that the change in material characteristics generated in the pressing side 230 may be shown to be close to a gradient change (as shown in FIG. 1B'), but the invention is not limited thereto.

Figure 4:
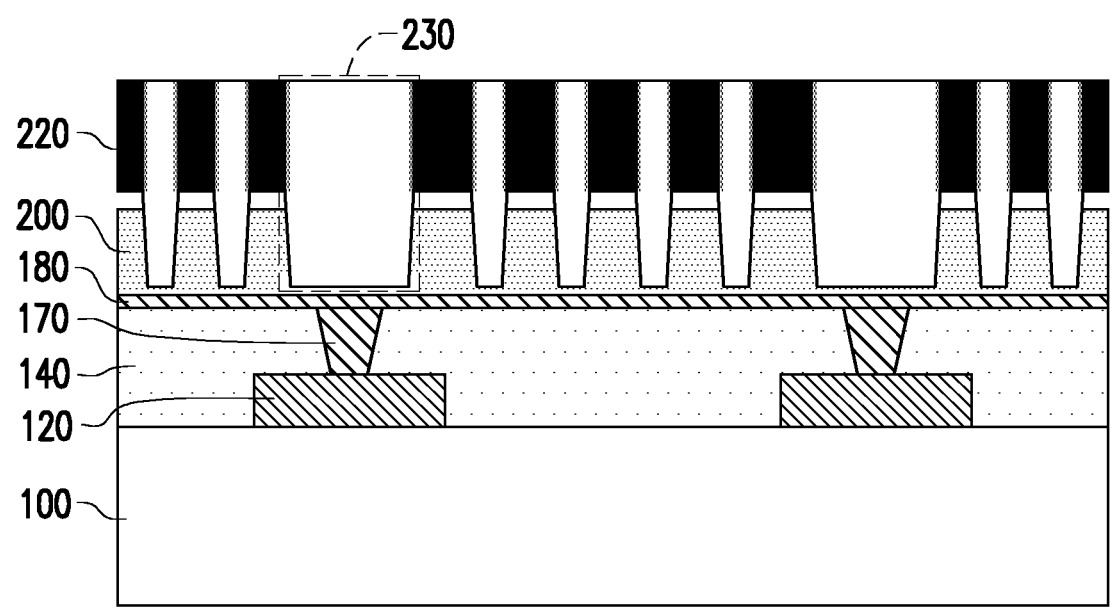
FIG. 4 is a schematic of the variation in light transmittance effect of a pressing side when a positive photoresist is used.

In the present embodiment, the photoresist layer 200 is a negative photoresist, but the invention is not limited thereto. In other embodiments, the photoresist layer 200 can also be a positive photoresist, wherein the irradiated portion thereof in the exposure process is removed in the developing process. Therefore, in the case that the piezochromic stamp 220 itself is made by a piezochromic material, depending on the material of the piezochromic stamp 220, when the piezochromic stamp 220 is in contact with the conductive seed layer 180, the light transmittance effect of the pressing side 230 is changed from blocking light having a specific wavelength to allowing light having the specific wavelength to pass through (as shown in FIG. 4), and the other portions of the piezochromic stamp 220 still block light having the specific wavelength. As a result, in the exposure process, the photoresist layer 200 below the pressing side 230 is irradiated and removed in the developing process, and the photoresist layer 200 below the other portions of the piezochromic stamp 220 is not irradiated and is not removed in the developing process. Moreover, in the present embodiment, since the light transmittance effect of the pressing side 230 needs to be completely changed from blocking light having a specific wavelength to allowing light having the specific wavelength to pass through, the exerted pressure needs to be sufficient to change the light transmittance effect of the entire pressing side 230. The pressure to the portion of the piezochromic stamp 220 adjacent to the pressing side 230 is gradually decreased away from the pressing side 230 in the horizontal direction of the figure (as shown in FIG. 4).

In the manufacturing method of a circuit board of the invention, the pressing side 230 of the piezochromic stamp 220 subjected to pressure can change the light transmittance effect from allowing light having a specific wavelength to pass through to blocking light having the specific wavelength, or the light transmittance effect of the pressing side 230 is changed from blocking light having a specific wavelength to allowing light having the specific wavelength to pass through, and therefore after an exposure process is performed on the photoresist layer 200, the residual photoresist layer 200 can be removed in a simple manner using a developing solution to precisely transfer the circuit pattern to be formed to form the patterned photoresist layer 240.

Figure 2A:
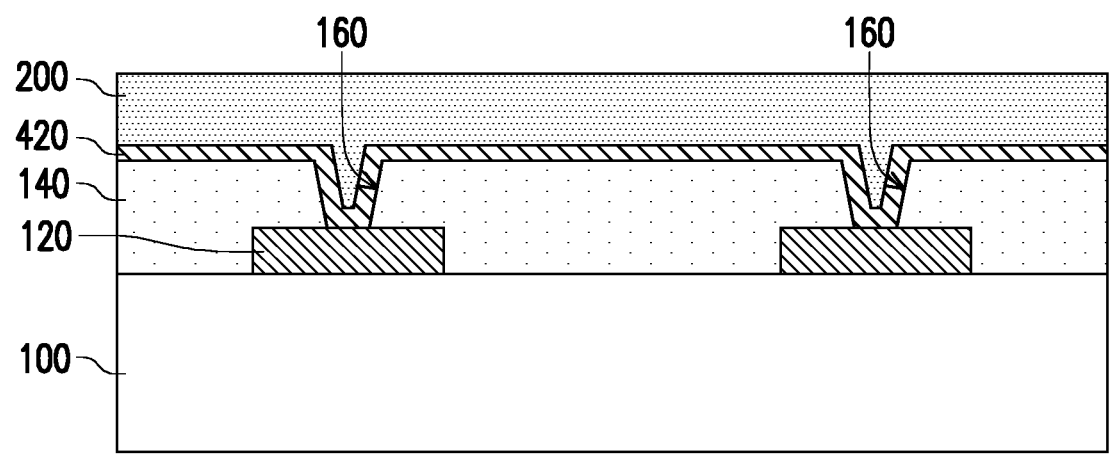
FIG. 2A to FIG. 2B are schematics of the manufacturing method of a circuit board according to the second embodiment of the invention.
Figure 2B:
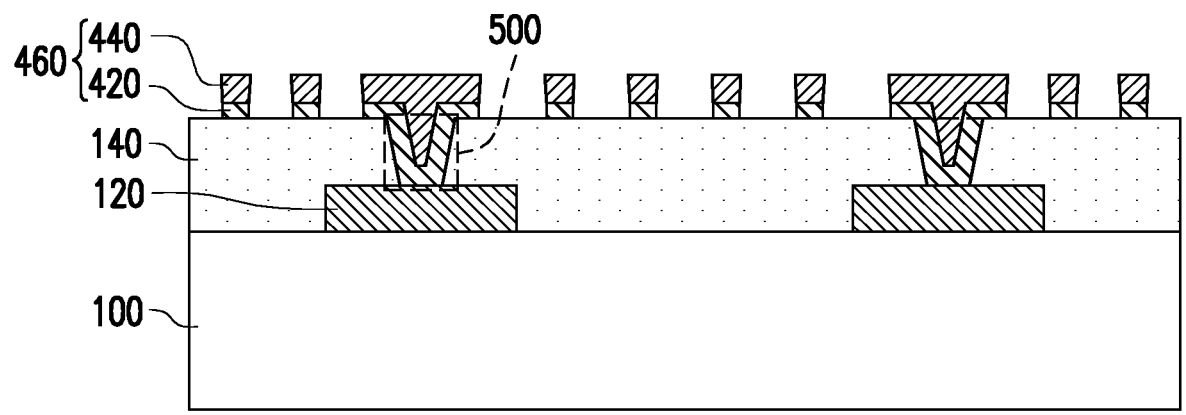

FIG. 2A to FIG. 2B are schematics of the manufacturing method of a circuit board according to the second embodiment of the invention.

Referring to FIG. 2A, a circuit pattern 120 is formed on a dielectric substrate 100. Next, a dielectric layer 140 is formed on the dielectric substrate 100 and covers the circuit pattern 120 on the dielectric substrate 100, wherein the dielectric layer 140 has a hole 160 exposing a portion of the circuit pattern. Next, a conductive seed layer 420 is formed in the hole 160 and on the dielectric layer 140. In the present embodiment, the conductive seed layer 420 is formed on the side surface and the bottom surface of the hole 160. Next, the photoresist layer 200 is formed on the conductive seed layer 420 and the hole 160 is completely filled.

Then, referring to FIG. 2B, the manufacturing steps of FIG. 1B to FIG. 1F are performed to form a circuit pattern 460 (formed by a patterned metal layer 440 and the conductive seed layer 420 located on the dielectric layer 140 below the patterned metal layer 440) and a conductive via 500 (including the conductive seed layer 420 and the patterned metal layer 440 in the hole 160) connected to the circuit pattern 460 and the circuit pattern 120. Based on the above, the difference between the second embodiment and the first embodiment of the invention is only in that the conductive seed layer 420 is formed on the side surface and the bottom surface of the hole 160, and therefore the connecting relationship, material, and forming method of each of the other components are as described in detail above and are not repeated herein.

FIG. 3A to FIG. 3E are schematics of the manufacturing method of a circuit board according to the third embodiment of the invention. In the present embodiment, the pressing side of the piezochromic stamp includes a portion of the piezochromic stamp and a piezochromic material layer attached to the portion. However, in another embodiment, the piezochromic stamp itself can also be made by a piezochromic material.

Figure 3A:
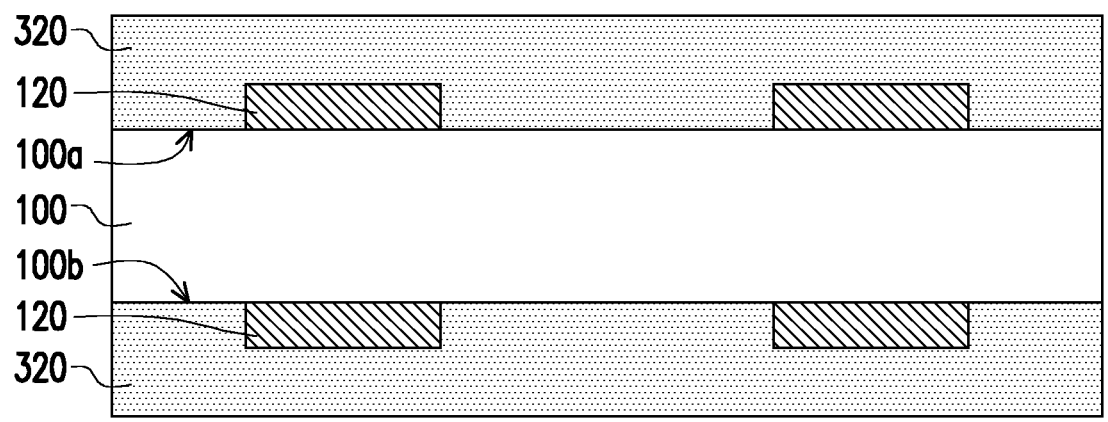
FIG. 3A to FIG. 3E are schematics of the manufacturing method of a circuit board according to the third embodiment of the invention.

Referring to FIG. 3A, a circuit pattern 120 is formed on a dielectric substrate 100, wherein the circuit pattern 120 can be formed on a first surface 100a and a second surface 100b of the dielectric substrate 100. The circuit pattern 120 is formed by, for instance, first forming a conductive layer on the dielectric substrate 100 via a lamination method and performing a patterning process on the conductive layer. The material of the dielectric substrate 100 is, for instance, epoxy resin, glass fiber cloth, or ceramic. The material of the circuit pattern 120 is, for instance, copper.

Next, a photosensitive dielectric layer 320 is formed on the dielectric substrate 100 and covers the circuit pattern 120 on the dielectric substrate 100. The photosensitive dielectric layer 320 is, for instance, formed on the dielectric substrate 100 via a lamination method.

Figure 3B:
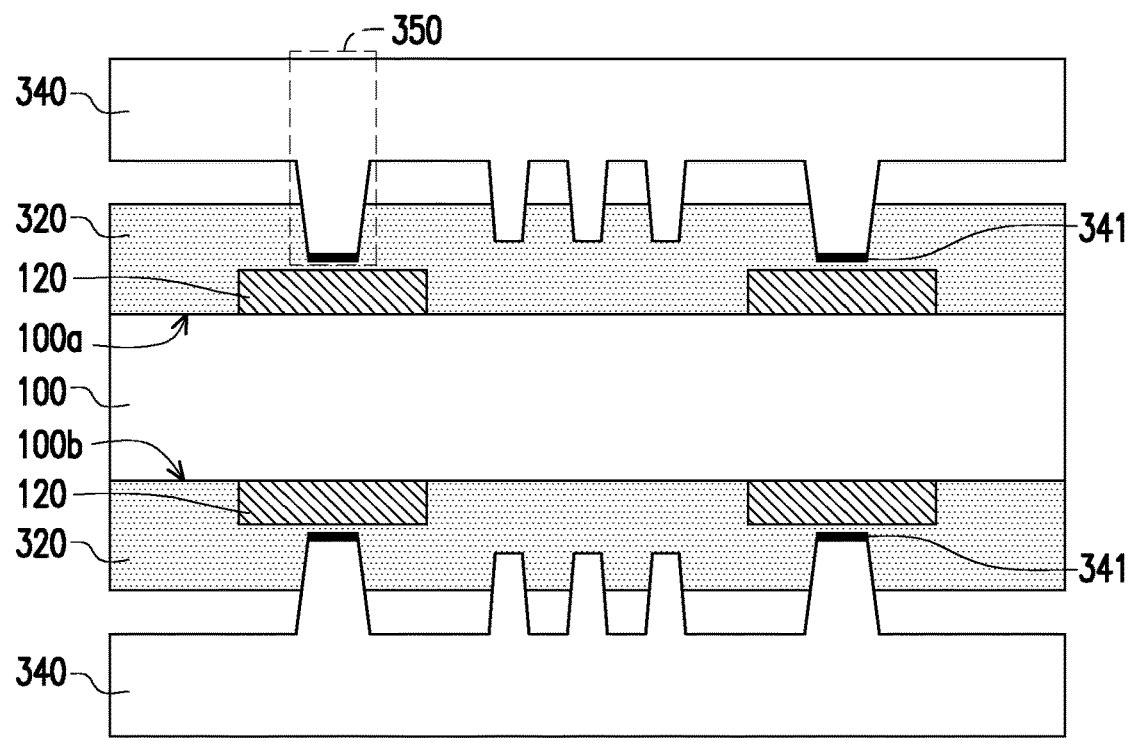

Referring to FIG. 3B, imprinting is performed on the photosensitive dielectric layer 320 via a piezochromic stamp 340. The piezochromic stamp 340 has a pattern corresponding to the circuit pattern to be formed on the dielectric substrate 100. When the piezochromic stamp 340 is pressed on the photosensitive dielectric layer 320, mechanical deformation can occur to the photosensitive dielectric layer 320, such that a pattern is precisely transferred to the photosensitive dielectric layer 320. In the imprinting process, a pressing side 350 of the piezochromic stamp 340 in contact with the circuit pattern 120 generates a counterforce to form a pressure, such that when the piezochromic stamp 340 is in contact with the circuit pattern 120, the light transmittance effect of the pressing side 350 is changed from allowing light having a specific wavelength to pass through to blocking light having the specific wavelength, or the light transmittance effect of the pressing side 350 is changed from blocking light having a specific wavelength to allowing light having the specific wavelength to pass through. "The piezochromic stamp 340 is in contact with the circuit pattern 120" means that a very thin and unavoidable photosensitive dielectric layer 320 exists between the piezochromic stamp 340 and the circuit pattern 120 (as shown in FIG. 3B). In particular, for the large contact area between the piezochromic stamp 340 and the circuit pattern 120, the very thin and unavoidable photosensitive dielectric layer (also referred to as photosensitive dielectric layer residue) is largely concentrated in the center of the contact region (not specifically shown in the figure). For instance, the thickness distribution of the photosensitive dielectric layer residue shows a roughly Gaussian distribution from the periphery to the center (not specifically shown in the figure).

Specifically, in the present embodiment, since the photosensitive dielectric layer 320 is a negative photosensitive dielectric layer, when the piezochromic stamp 340 is in contact with the circuit pattern 120, the light transmittance effect of the pressing side 350 needs to be changed from allowing light having a specific wavelength to pass through to blocking light having the specific wavelength. For instance, in the case that the photosensitive dielectric layer 320 is cured by UV irradiation, when the piezochromic stamp 340 is in contact with the circuit pattern 120, the pressing side 350 is changed to blocking UV light transmittance, and the other portions of the piezochromic stamp 340 still allow UV light transmittance.

Next, exposure is performed on the photosensitive dielectric layer 320 via a UV light by using the piezochromic stamp 340 as a mask. In the present embodiment, since the photosensitive dielectric layer 320 is a negative photosensitive dielectric layer and the piezochromic material layer 341 can block transmittance of the light used in the exposure process, the photosensitive dielectric layer 320 between the piezochromic material layer 341 and the circuit pattern 120 is not irradiated, and the other portions of the photosensitive dielectric layer 320 are cured by irradiation.

Figure 3C:
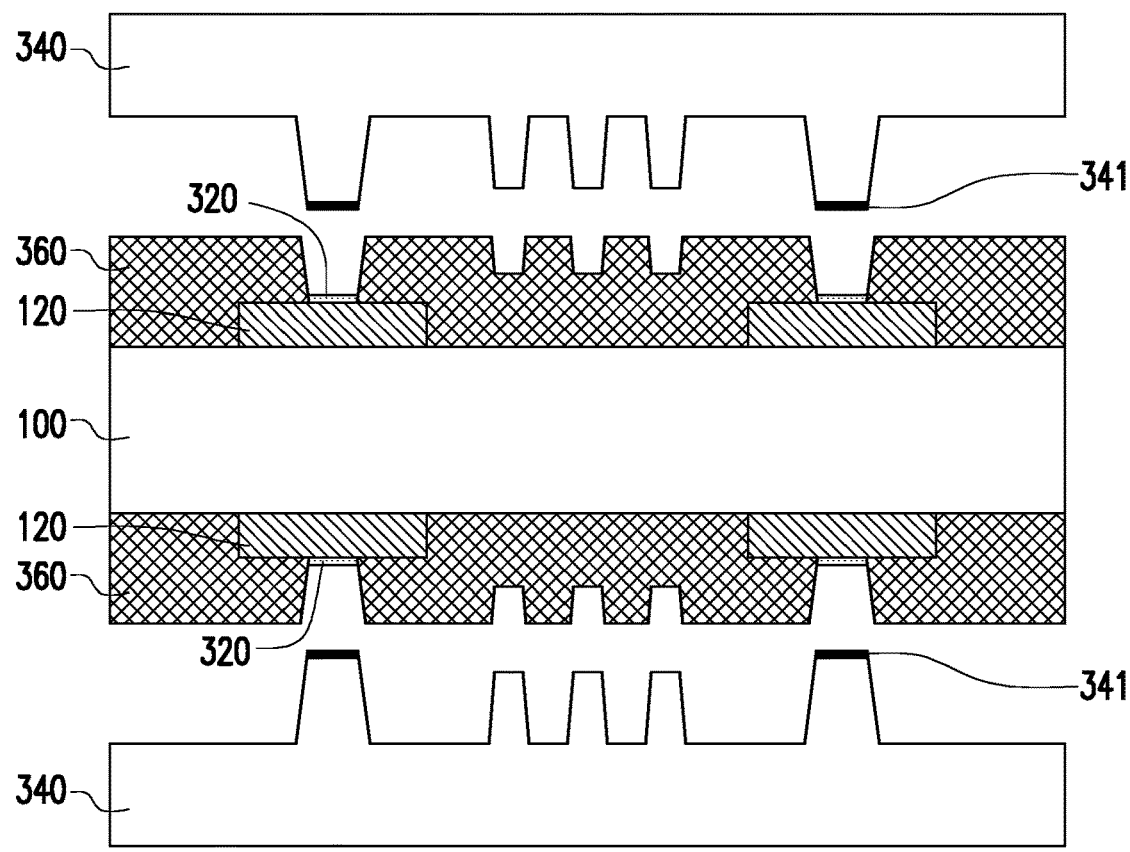

Referring to FIG. 3C, after the exposure process, the piezochromic stamp 340 is removed. At this point, a cured patterned photosensitive dielectric layer 360 is formed on the dielectric substrate 100 and the circuit pattern 120, and the uncured photosensitive dielectric layer 320 remains on the circuit pattern 120.

Figure 3D:
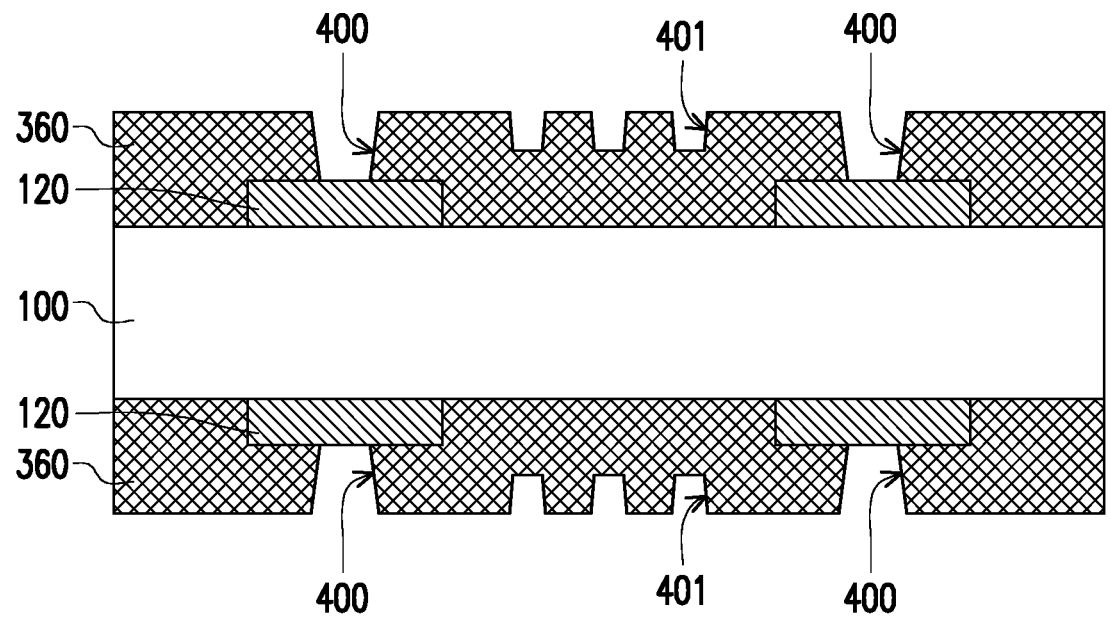

Referring to FIG. 3D, a developing process is performed. Since the cured patterned photosensitive dielectric layer 360 is not removed in the developing process and only the uncured photosensitive dielectric layer 320 is removed, a hole 400 exposing a portion of the circuit pattern 120 and a trench 401 not exposing the circuit pattern can be formed. In other words, via the method of FIG. 3A to FIG. 3D, the pattern of the piezochromic stamp 340 can be precisely transferred in the photosensitive dielectric layer 320 to form the patterned photosensitive dielectric layer 360.

Figure 3E:
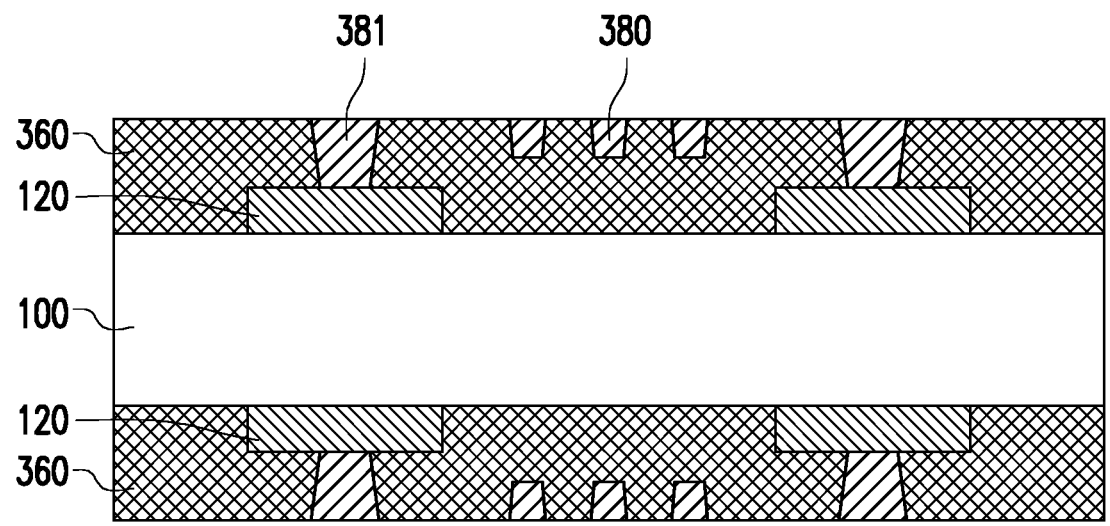

Referring to FIG. 3E, a conductive material is respectively filled in the hole 400 and the trench 401 to form an embedded circuit layer 380 and a conductive via 381 electrically connected to the circuit pattern 120. The material of the embedded circuit layer 380 and the conductive via 381 is, for instance, copper.

In the present embodiment, the photosensitive dielectric layer 320 is a negative photosensitive dielectric layer, but the invention is not limited thereto. In other embodiments, the photosensitive dielectric layer 320 can also be a positive photosensitive dielectric layer, wherein the irradiated portion thereof in the exposure process is removed in the developing process. Therefore, in the case that the piezochromic stamp 340 itself is formed by a piezochromic material, depending on the material of the piezochromic stamp 340, the piezochromic stamp 340 of the present embodiment is the same as the piezochromic stamp 220 of the first embodiment of the invention and is therefore not repeated herein.

It can be known from the present embodiment that, in the manufacturing method of a circuit board of the invention, the pressing side 350 of the piezochromic stamp 340 subjected to pressure can change the light transmittance effect from allowing light having a specific wavelength to pass through to blocking light having the specific wavelength, or the light transmittance effect of the pressing side 350 is changed from blocking light having a specific wavelength to allowing light having the specific wavelength to pass through, and therefore after an exposure process is performed on the photosensitive dielectric layer 320, the residual photosensitive dielectric layer 320 can be removed in a simple manner using a developing solution to precisely transfer the circuit pattern to be formed to form the patterned photosensitive dielectric layer 360. Moreover, in the present embodiment, the photosensitive dielectric layer 320 can omit the process of forming the photoresist layer on the dielectric layer and can form the hole 400 in the photosensitive dielectric layer 320 via a method of exposure and developing, and therefore the production cost of the circuit board can be reduced.

Based on the above, in the manufacturing method of a circuit board of the invention, the piezochromic stamp has a pattern corresponding to the circuit pattern to be formed on the dielectric substrate, and when the piezochromic stamp is pressed on the photoresist layer or the photosensitive dielectric layer, mechanical deformation can occur to the photoresist layer or the photosensitive dielectric layer to precisely transfer the pattern to the photoresist layer or the photosensitive dielectric layer. Moreover, in the imprinting process, the pressing side of the piezochromic stamp in contact with the conductive seed layer or the circuit pattern generates a counterforce to form a pressure, such that when the pressing side of the piezochromic stamp is in contact with the conductive seed layer or the circuit pattern, the light transmittance effect of the pressing side is changed from allowing light having a specific wavelength to pass through to blocking light having the specific wavelength, or the light transmittance effect of the pressing side is changed from blocking light having a specific wavelength to allowing light having the specific wavelength to pass through. Therefore, after an exposure process is performed on the photoresist layer or the photosensitive dielectric layer, the remaining photoresist layer or photosensitive dielectric layer can be removed in a simple manner using a developing solution, so as to precisely transfer the circuit pattern to be formed to the patterned photoresist layer or the patterned photosensitive dielectric layer.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A piezochromic stamp, comprising a pressing side and remaining portions unpressed, wherein
   when the pressing side of the piezochromic stamp is subjected to a pressure, a light transmittance effect of the pressing side is changed from allowing a light having a specific wavelength to pass through to blocking the light having the specific wavelength while the remaining portions of the piezochromic stamp still allow the light having the specific wavelength to pass through, or
   when the pressing side of the piezochromic stamp is subjected to a pressure, the light transmittance effect of the pressing side is changed from blocking the light having the specific wavelength to allowing the light having the specific wavelength to pass through while the remaining portions of the piezochromic stamp still block the light having the specific wavelength.

* * * * *